United States Patent [19]

Joshi

[11] 4,180,863

[45] Dec. 25, 1979

[54] MAGNETIC DOMAIN DEVICE MODULAR ASSEMBLY

[75] Inventor: Kailash C. Joshi, Endwell, N.Y.

[73] Assignee: International Business Machines Corporation, Armonk, N.Y.

[21] Appl. No.: 920,927

[22] Filed: Jun. 30, 1978

[51] Int. Cl.² .................. G11C 19/08; G11C 5/04
[52] U.S. Cl. ............................. 365/2; 365/37
[58] Field of Search ........................ 365/2, 37

[56] References Cited

U.S. PATENT DOCUMENTS

| | | | |
|---|---|---|---|
| 3,786,445 | 1/1974 | Ho et al. | 365/1 |
| 3,996,574 | 12/1976 | Bobeck et al. | 365/2 |

OTHER PUBLICATIONS

IBM Technical Disclosure Bulletin-vol. 15; No. 6. Nov. 1972, pp. 2001-2002.

*Primary Examiner*—James W. Moffitt
*Attorney, Agent, or Firm*—Norman R. Bardales

[57] ABSTRACT

Plural groups of one or more magnetic domain devices each are mounted in an array on the circuitized surface of a common substrate. A rectangular pattern of slots is provided in the substrate around each group. Each group is encompassed through the slots by the turns of the inner and outer orthogonal solenoids of its own exlusive rotational magnetic field drive system and permanent magnet bias field closed structure. Each device has a pattern of I/O pads located on its undersurface which are bonded to a corresponding pattern of terminal pads which are part of the circuitized surface of the substrate. The interconnecting signal lines to the terminal pads of the substrate pass through one or more of the four intersection corners formed between the slots of the rectangular pattern. Preferably, the substrate also accommodates integrated circuit modules and/or other components mounted thereon which are associated with the drive, sense and other support circuitry for the magnetic domain devices.

11 Claims, 5 Drawing Figures

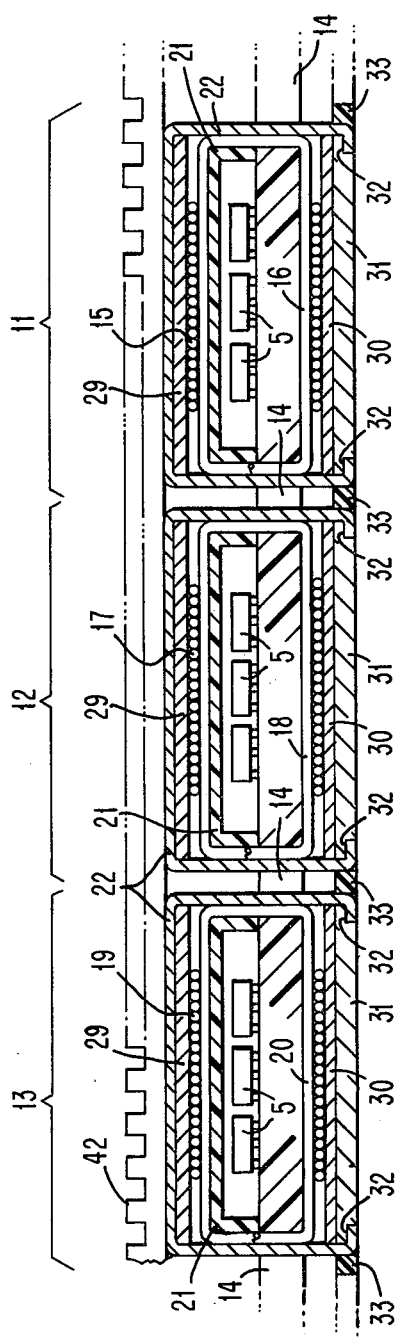
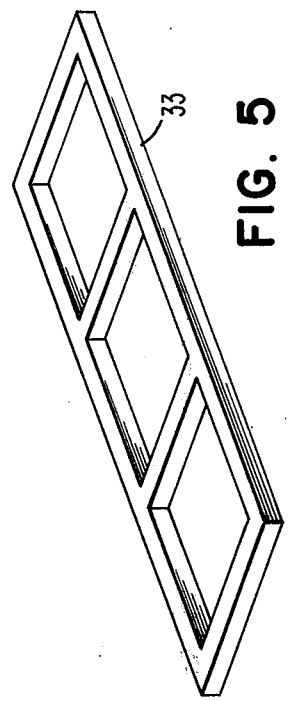
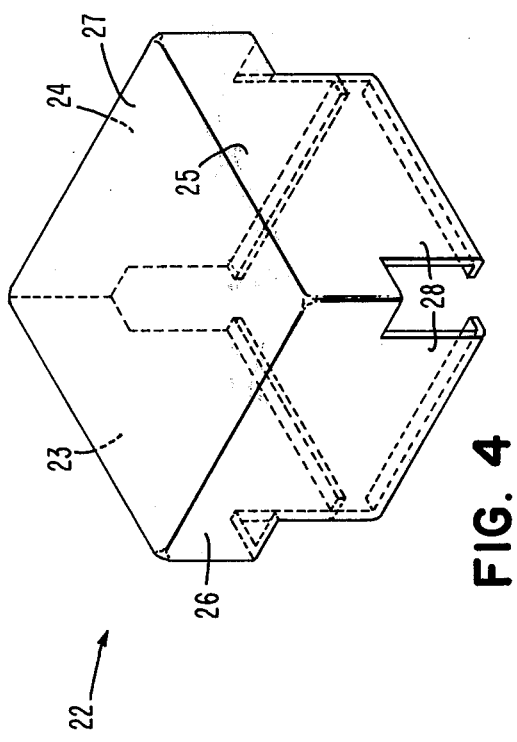

MAGNETIC DOMAIN DEVICE MODULAR ASSEMBLY

BACKGROUND OF THE INVENTION

1. Field of the Invention

This invention relates to improvements in field-accessed magnetic domain device assemblies which are encompassed within a rotational magnetic field drive coil system.

2. Description of the Prior Art

As applications for magnetic domain devices, also referred to in the art as bubble devices or chips, increase and, more specifically, as the number of bubble devices required for each particular application increases, there is a need for modularized packaging of the devices in mass assemblies in a reliable and economic manner. Heretofore, because such devices also require components such as, for example, rotational field coils, permanent magnet bias systems, shielding and the like, as well as support circuitry therefor, packaging of the devices and their components have not been conducive to mass and modular assembly. Examples of the prior art which typify various approaches for packaging magnetic domain devices and components are as follows, to wit: U.S. Pat. Nos. 3,701,125; 3,711,838; 3,786,445; 3,899,779; 3,958,155; 3,996,574; 4,017,604; 4,027,295 and 4,027,300.

Briefly, none of these references or any other prior art of which I am aware provides a modular assembly which is simple, readily expandable, easily fabricated, readily integratable or compatible with other circuit componentry using printed circuit interconnection technology, and/or minimizes space requirements for mounting the devices and/or associated magnetic field components and/or support circuit components.

SUMMARY OF THE INVENTION

An object of this invention is to provide an improved magnetic domain device modular assembly.

Another object of this invention is to provide an improved magnetic domain device modular assembly for magnetic domain devices employing encompassing rotational magnetic field coil drive systems and closed magnetic bias field systems.

Still another object is to provide a magnetic domain device modular assembly of the aforementioned kind which is simple, readily expandable and easily fabricated.

Still another object of this invention is to provide a magnetic domain device modular assembly of the aforementioned kind which is readily integratable and/or compatible with other circuit componentry using printed circuit interconnection technology, and/or minimizes space requirements for mounting the magnetic domain devices, the components associated with the generation of the rotational and bias magnetic field systems, and/or support circuitry components thereof.

According to one aspect of the invention, there is provided magnetic domain device modular assembly apparatus which has a substrate with at least one surface with a predetermined circuitized pattern thereon. Plural groups of magnetic domain devices are mounted on the substrate and electrically connected to the circuitized pattern. Each of the groups has at least one of the magnetic domain devices. Plural rectangular patterns of slots are disposed through the substrate. Each of the rectangular patterns circumscribes a mutually exclusive one of the groups. Plural rotational magnetic field coil drive systems are provided. Each of the drive systems coacts with a mutually exclusive particular one of the groups of magnetic domain devices. Each drive system encompasses the particular one of the groups with which it coacts through the slots of the rectangular pattern that circumscribes that particular group. Also provided are plural closed magnetic bias field systems. Each of the bias field systems coacts with a mutually exclusive one of the groups of magnetic domain devices and the latter's encompassing drive system. Each of the bias field systems encloses the lastmentioned one of the groups and its encompassing drive system through the slots of the rectangular pattern circumscribing the lastmentioned one of the groups.

The foregoing and other objects, features and advantages of the invention will be apparent from the following more particular description of a preferred embodiment of the invention, as illustrated in the accompanying drawing.

BRIEF DESCRIPTION OF THE DRAWING

FIG. 2 is an enlarged partial cross-sectional view of the apparatus of FIG. 1 taken along the lines 2—2 of FIG. 1;

FIG. 4 is a perspective view of part of one of the bias magnetic field closed structures of FIGS. 1-2; and FIG. 5 is a perspective view of an interlocking member for the magnetic field closed structures of FIGS. 1-2.

In the figures, like elements are designated with similar reference numbers.

DESCRIPTION OF THE PREFERRED EMBODIMENT

Figure 1:
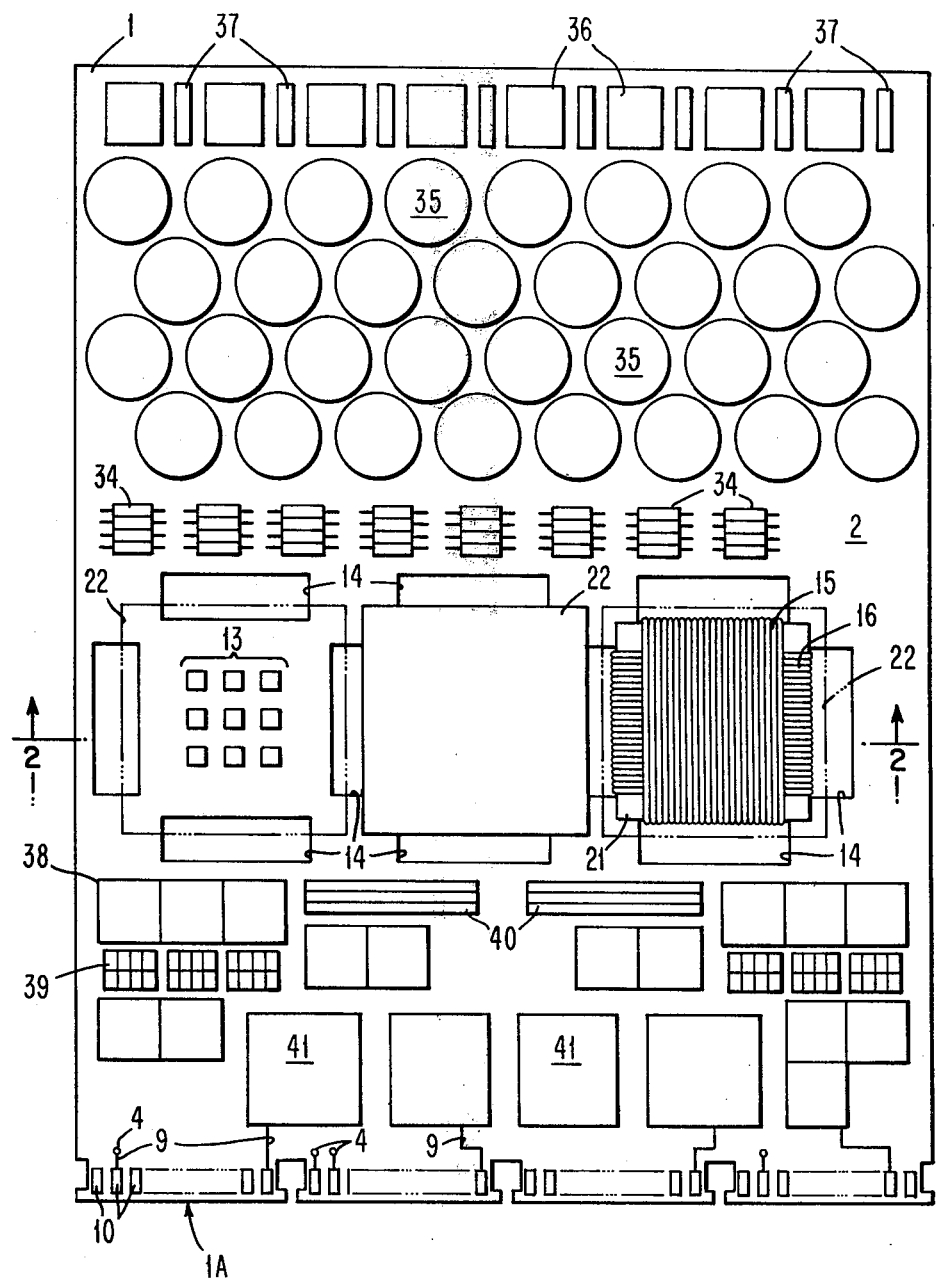
FIG. 1 is a plan view of a preferred embodiment of the magnetic domain device modular assembly apparatus of the present invention.
Figure 3:
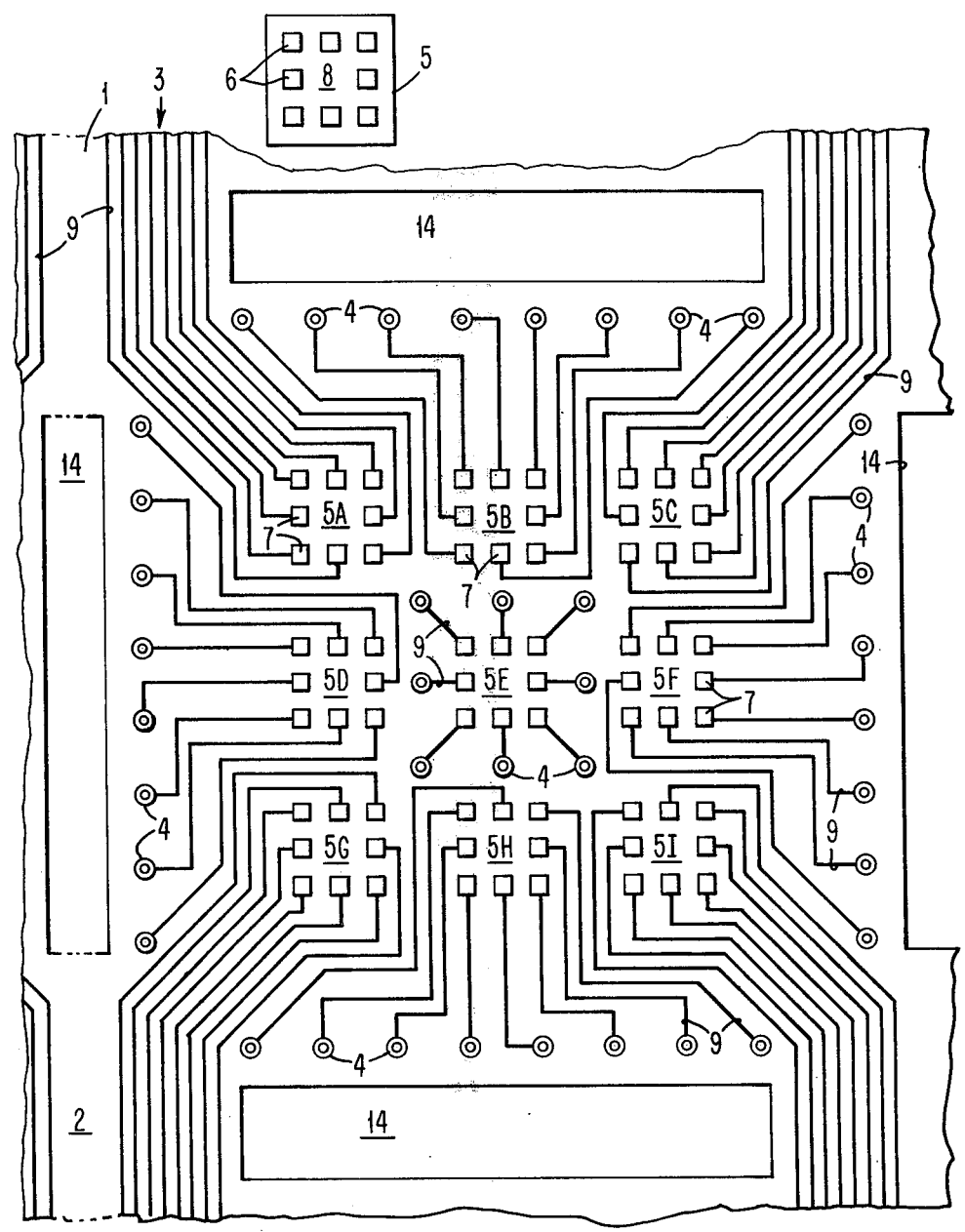
FIG. 3 is an enlarged partial plan view illustrating the assembly relationship of one of the magnetic domain devices and the substrate of FIGS. 1-2.

Referring to FIGS. 1-3, there is shown a preferred embodiment of the field accessed magnetic device modular assembly apparatus of the present invention. More particularly, in the apparatus of FIGS. 1-3 planar substrate 1 has at least one surface, cf. surface 2 that has a printed circuit pattern 3 thereon. Pattern 3 is only partially shown in FIGS. 1 and 3 and omitted in FIG. 2 for sake of clarity. The embodiment of substrate 1 is a multi-layer printed circuit board to simplify cross connections. Printed circuit pattern 3 and the other printed circuit patterns, which are not shown in the Figures for sake of clarity and which are associated with the other layers of substrate 1, are interconnected by suitable means such as plated via holes 4, cf. FIG. 3, and the like in a manner well-known to those skilled in the art.

Magnetic domain devices or chips 5 are mounted on surface 2 of substrate 1 and are electrically connected to pattern 3. As shown in greater detail in FIG. 3, each chip 5 has an array of I/O, i.e. input/output, terminals 6. On substrate 1 at each chip mounting site such as sites 5A, 5B, etc. there is a corresponding array of printed circuit interconnection pads 7 which are part of pattern 3 and which are in register with the corresponding array of I/O terminals 6 of the particular chip 5 to be mounted thereat. By way of example, each of the chips 5 have identical planar rectangular configurations and I/O pad patterns of eight pads 6 arranged symmetrically around the periphery of its lower surface 8. Pads 6 are bonded by suitable means, e.g. solder, to the corresponding pads 7 of board 1. Pads 7 are in turn connected to selected printed circuit conductor 9 of pattern 3, some of which conductors 9 are connected to plated via holes 4 for interconnection to the aforementioned other printed circuit patterns, not shown, associated with the other layers, i.e. levels, of multilayer board 1. Multilayer board 1 has a row of plural aligned I/O pads 10, which are also part of pattern 3, along one of its edges, e.g. edge 1A. Pads 10 are connected to selected conductors 9 of pattern 3, some of which in turn are connected to some other plated via holes 4. As such, the substrate 1 is pluggable connectable to receptacles, not shown, which have corresponding aligned plural slide contact members which engage the pads 10 when the edge 1A of the board 1 is inserted into the receptacles. Other alternatives for the terminals of board 1 may be utilized such as, for example, terminal pins affixed to and in aligned arrangement around one or more edges of the board 1 and extended perpendicularly outward from the surface opposite to surface 2 for engagement with an appropriate pin receiving receptacle.

Chips 5 are modularly arranged in plural groups on the board 1, with each group having one or more chips 5. For purposes of explanation in the embodiment of FIGS. 1-3, the chips 5 are arranged in a rectangular array of identical groups, which array consists of a single row of three groups generally designated by the reference numerals 11, 12, 13, cf. FIG. 2. The group 11-13 in turn in the embodiment of FIGS. 1-3 have the same number of chips 5 each, to wit: nine each, arranged in identical three-by-three rectangular arrays, cf. array of chips 5 of group 13, FIG. 1. It should be understood that either or both particular type arrays, i.e. the group array or the chip array, may be modified to have more or less rows, columns, or chips 5 in the particular type array.

Circumscribing each group 11, 12, 13 of chips 5 is a rectangular pattern of slots 14 through the board 1. To conserve board real estate, i.e. space, and/or for ease of fabrication slots 14 between adjacent groups are commonly shared by the two particular circumscribing rectangular patterns. Thus, the slot 14 between the two adjacent groups 11 and 12 are shared by the two rectangular patterns of slots 14 associated with groups 11 and 12. Likewise, the slot 14 between the two adjacent groups 12 and 13 are shared by the two rectangular patterns associated with these two lastmentioned groups.

Mutually exclusive rotational magnetic field coil drive systems 15-16, 17-18 and 19-20 are provided for coaction with groups 11, 12, 13, respectively, cf. FIG. 2. Each system 15-16, 17-18, 19-20 encompasses its particular one of the groups 11-13 through the slots 14 of the particular rectangular pattern circumscribing that particular group. Each one of the particular systems 15-16, 17-18, 19-20 has a pair of orthogonal solenoids referred to in the art as the X and Y coils. For sake of explanation, outer coils 15, 17 and 19 are arbitrarily designated herein as the X coils of their particular system and inner coils 16, 18 and 20 are hence designated as the Y coils of their particular system. It should be noted in the embodiment of FIGS. 1-3 that the turns of an outer coil, e.g. coils 15, 17, 19 pass through the respective pair of parallel horizontal slots 14 of the particular rectangular pattern as viewed facing FIG. 1, and the turns of an inner coil, cf. coils 16, 18, 20 pass through the respective pair of parallel vertical slots 14 of the particular rectangular pattern. Coils 15-20 are preferably torroidally wound solenoid types but can be segmented preformed solenoid types of either the discrete wire or printed circuit kind. In any case, the chips 5 of a particular group is encompassed within the inner coil which in turn is encompassed by the outer coil in the orthogonal direction. Preferably, an internal hollow coverlike non-magnetic member 21 with sufficient internal clearance for the chips 5 is provided for each group 11-13 and suitably sealed to substrate 1. Cover 21 facilitates the formation of the turns of the particular X and Y coils encompasses thereby.

Also coacting with and enclosing each of the group 11-13 of chips 5 through slots 14 of the particular rectangular pattern of slots 14 circumscribing the particular group is a mutually exclusive closed magnetic bias field system next to be described. Each bias field system has an open-ended box-like member 22 of magnetically conductive material, e.g. soft iron. As shown in greater detail in FIGS. 3 and 4, member 22 has four vertical closed sides, 23-26 depending from its closed end or base 27. Depending from the lower edge of each of the sides 23-26 is a resilient tab-like member 28, each of which passes through one of the four slots 14 of their particular associated rectangular pattern. As part of each of the bias field systems in the embodiment of FIGS. 1-3, there are a pair of appropriately oriented permanent magnets 29, 30 having rectangular planar orientations. Upper magnets 29 are juxtaposed between the turns of the respective outer coils 15, 17, 19, and inner surfaces of bases 27, as viewed facing FIG. 2. Lower magnets 30 are juxtaposed between the turns of the respective outer coils 15, 17, 19 and inner surfaces of the planar rectangular magnetically conductive, e.g. soft iron or ferrite, plates 31, each of which is part of the particular bias field system. Plate 31 has an inverse L-shaped peripheral edge 32 which mates with the L-shaped peripheral edges of tab 28, which tabs 28 in cooperation with slots 14 resiliently maintain the closed system 22-30 in an enclosed relationship about the X and Y coils and chips 5 encompassed thereby. Preferably, a non-conductive interlocking spacer member 33, cf. FIGS. 2 and 5, can also be used to maintain resilient tabs 28 biased inwardly with respect to the open ends of the respective members 22.

For each particular one of the groups 11-13, the magnetic bias field provided by the associated one of the systems 22-32 creates and maintains stable bubbles of a certain size in the magnetic bubble material of the devices 5 of the particular group as is well known to those skilled in the art. The permanent magnetic bias assures the basic non-volatility of the devices 5 in the bias field which thereafter acts and reacts under the influence of the rotational magnetic field generated by the particular pair of orthogonal X and Y field coils associated with the particular group and operating in concert. The particular bias magnetic structure of each system 22-32 is referred to in the art as a closed field structure. As is well known to those skilled in the art, the rotational magnetic field that is generated by the pair of X and Y coils propagates the bubbles through the bubble material of the devices 5.

The embodiment of FIGS. 1-3 is shown by way of example as being part of a bubble memory application. As such, the board 1 has mounted thereon and electrically connected to its pattern 3 active and passive components such as, for example, sense amplifiers 34, integrated circuit drivers 35 and other appropriate support circuit componentry 36–41. Also connected to the pattern 3 are the field coils 15–20, the interconnections of the coils 15–20 and components 34–41 being omitted for sake of clarity.

Preferably, the board 1 is made of a quartz and an organic resin so that the board 1 has a coefficient expansion compatible to, i.e. matching, that of the material used for the domain chips 5. A common heat sink cover 42, cf. FIG. 2, is preferably used to dissipate the heat from the board 1 and components mounted thereon.

As is apparent to those skilled in the art, the board 1 of the assembly apparatus of FIGS. 1–3 is readily expandable to accommodate additional rows and columns of groups of devices 5. Moreover, in a common application where plural such assemblies are required, they are readily stackable. It should be readily understood, that other components, such as shielding or field compensators could also be incorporated with each particular group. Moreover, it should be understood that for sake of clarity the connection density between each chip 5 and board 1 is shown in the Figures as being eight, cf. terminals 6 of chip 5 and pads 7 of board 1. However, as is apparent to those skilled in the art, the invention may be practiced with lower or higher connection densities and is particularly adaptable to high density connections.

While the invention has been particularly shown and described with reference to a preferred embodiment thereof, it will be understood by those skilled in the art that various changes in form and details may be made therein without departing from the spirit and scope of the invention.

I claim:
1. Field accessed magnetic domain device modular assembly apparatus comprising:
   a substrate having at least one surface with a predetermined circuitized pattern thereon,
   plural groups of magnetic domain devices mounted on said substrate and electrically connected to said circuitized pattern, each of said groups having at least one of said magnetic domain devices,
   plural rectangular patterns of non-open ended slots disposed through said substrate, each of said groups being circumscribed by four of said slots arranged in one of said rectangular patterns,
   plural rotational magnetic field coil drive systems, each of said drive systems having orthogonal first and second coils of plural turns each and coacting with a mutually exclusive particular one of said groups of magnetic domain devices, the turns of said first coil of each system encompassing said particular one of said groups through two opposing slots circumscribing said particular one of said groups, the turns of said second coil of each system encompassing said first coil and said particular one of said groups encompassed by said first tab through the other two opposing slots circumscribing said particular one of said groups, and
   plural closed magnetic bias field systems, each of said bias field systems coacting with a mutually exclusive one of said groups of magnetic domain devices and the latter's said encompassing drive system, each of said bias field systems having means for enclosing the lastmentioned said one of said groups and its said encompassing drive system, said means being extended through the slots circumscribing said lastmentioned one of said groups and being resiliently engageable with said last mentioned slots.

2. Apparatus according to claim 1 wherein said magnetic domain devices and said substrate have compatible thermal coefficient of expansion characteristics.

3. Apparatus according to claim 1 further comprising plural circuit components mounted to said substrate and electrically connected to said circuitized pattern said components being part of the associated circuitry for said magnetic domain devices.

4. Apparatus according to claim 1 wherein said substrate is of the multilayer type.

5. Apparatus according to claim 1 further comprising heat sink cover means in thermal coupling relationship with said groups of magnetic domain devices and said rotational magnetic field and bias field systems.

6. Field accessed magnetic domain device modular assembly apparatus comprising:
   a planar substrate having at least one surface with a predetermined circuitized pattern thereon,
   plural groups of magnetic domain devices mounted on said substrate and electrically connected to said circuitized pattern, each of said groups having at least one of said magnetic domain devices, each of said magnetic domain devices having a planar surface with a predetermined array of input/output printed circuit terminals thereon, said circuitized pattern having a corresponding array of printed circuit pads for each of said devices, said pads being bonded to said terminals,
   plural rectangular patterns of non-open ended elongated slots disposed through said substrate, each of said groups being circumscribed by four of said slots, a first two of said four slots being in parallel coextensive alignment with respect to each other, the second other two of said four slots being in parallel coextensive alignment with respect to each other, said first two parallel slots being in orthogonal alignment with said second two parallel slots such that said four slots collectively form one of said rectangular patterns,
   plural rotational magnetic field coil drive systems, each of said drive systems having first and second coils coacting with a mutually exclusive particular one of said groups of magnetic domain devices, each of said coils having plural turns, the turns of said first coil of each of said drive systems encompassing said particular one of said groups through said first two parallel slots of the four slots circumscribing said particular one of said groups, and the turns of said second coil of each of said drive systems encompassing said first coil and said particular one of said groups through said second two parallel slots of the four slots circumscribing said particular one of said groups, and
   plural closed magnetic bias field systems, each of said bias field systems coacting with a mutually exclusive one of said groups of magnetic domain devices and the latter's said encompassing drive system, each of said bias field systems enclosing the lastmentioned said one of said groups and its said encompassing drive system, and each of said bias field systems comprising
      first and second planar permanent magnets outwardly juxtaposed on opposite sides of said second coil, a magnetizable enclosure having a base and four side walls, each of said side walls having a resilient tab extending-through and being in resilient engageable relationship-with one of said four slots of said rectangular pattern circumscribing the particular group, and a magnetizably planar member resiliently engaged by said tabs for completing said enclosure.

7. Apparatus according to claim 6 further comprising plural circuit components mounted to said substrate and electrically connected to said circuitized pattern said components being part of the associated circuitry for said magnetic domain devices.

8. Apparatus according to claim 6 wherein said substrate is of the multilayer type.

9. Apparatus according to claim 6 further comprising heat sink cover means in thermal coupling relationship with said groups of magnetic domain devices and said rotational magnetic field and bias field systems.

10. Apparatus according to claim 6 wherein at least one of said slots is common to two adjacent groups of magnetic domain devices.

11. Apparatus according to claim 6 further comprising non-conductive structural means for biasing said resilient tabs in said resilient engageable relationships.

* * * * *

UNITED STATES PATENT AND TRADEMARK OFFICE
CERTIFICATE OF CORRECTION

PATENT NO. : 4,180,863
DATED : December 25, 1979
INVENTOR(S) : Kailash C. Joshi

It is certified that error appears in the above-identified patent and that said Letters Patent are hereby corrected as shown below:

Claim 1, column 5, line 58, change "tab" to --coil--.

Signed and Sealed this

Seventeenth Day of June 1980

[SEAL]

Attest:

SIDNEY A. DIAMOND

Attesting Officer

Commissioner of Patents and Trademarks